US012805352B2

(12) United States Patent
Lee et al.

(10) Patent No.: US 12,805,352 B2
(45) Date of Patent: Nov. 17, 2026

(54) SEMICONDUCTOR PACKAGE

(71) Applicant: Samsung Electronics Co., Ltd., Suwon-si (KR)

(72) Inventors: Yongkoon Lee, Suwon-si (KR); Youngchan Ko, Suwon-si (KR); Byungho Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 510 days.

(21) Appl. No.: 18/191,212

(22) Filed: Mar. 28, 2023

(65) Prior Publication Data

US 2024/0021531 A1 Jan. 18, 2024

(30) Foreign Application Priority Data

Jul. 14, 2022 (KR) ........................ 10-2022-0086802

(51) Int. Cl.

*H01L 23/538* (2006.01)
*H01L 23/498* (2006.01)
*H10B 80/00* (2026.01)

(Continued)

(52) U.S. Cl.

CPC ............ *H10W 70/65* (2026.01); *H10B 80/00* (2023.02); *H10W 70/611* (2026.01);

(Continued)

(58) Field of Classification Search

CPC ............. H10W 70/611; H10W 70/618; H10W 70/635; H10W 70/65; H10W 70/655;

(Continued)

(56) References Cited

U.S. PATENT DOCUMENTS 12,388,046 B2 * 8/2025 Kim ........................ H01L 25/16
2006/0226527 A1 10/2006 Hatano et al.

(Continued)

FOREIGN PATENT DOCUMENTS

KR 10-2022-0001643 A 1/2022

*Primary Examiner* — Lawrence C Tynes, Jr.

(74) *Attorney, Agent, or Firm* — Wolf, Greenfield & Sacks, P.C.

(57) ABSTRACT

A semiconductor package includes a substrate including a first redistribution member including a first surface and a second surface, and including a first redistribution layer, an interconnection chip below the second surface and including an interconnection circuit electrically connected to the first redistribution layer, a via structure around the interconnection chip and electrically connected to the first redistribution layer, an encapsulant between the second surface and the interconnection chip and the via structure, a first pillar extending through the encapsulant to electrically connect the first redistribution layer and the interconnection circuit, a second pillar extending through the encapsulant to electrically connect the first redistribution layer and the via structure, and connection bumps below the interconnection chip and the via structure, and first and second chip structures on the first surface of the first redistribution member and electrically connected to the first redistribution layer. The first pillar and the second pillar have different shapes.

16 Claims, 15 Drawing Sheets

I-I'

(51) Int. Cl.

| | |
|---|---|
| ***H10W 70/60*** | (2026.01) |
| ***H10W 70/65*** | (2026.01) |
| ***H10W 70/685*** | (2026.01) |
| ***H10W 90/00*** | (2026.01) |
| *H10W 74/15* | (2026.01) |

(52) U.S. Cl.
CPC ....... *H10W 70/685* (2026.01); *H10W 90/701* (2026.01); *H10W 74/15* (2026.01); *H10W 90/724* (2026.01); *H10W 90/734* (2026.01)

(58) Field of Classification Search
CPC . H10W 90/724; H10W 90/734; H10W 90/00; H10W 72/90; H10W 72/823; H01L 2224/16227; H01L 2224/73204; H01L 2224/02379; H01L 2225/06513; H01L 2225/06548; H01L 23/5384; H01L 23/5381; H01L 23/3107
See application file for complete search history.

(56) References Cited

U.S. PATENT DOCUMENTS

| | | | | |
|---|---|---|---|---|
| 2016/0141234 | A1 | 5/2016 | We et al. | |
| 2020/0312767 | A1* | 10/2020 | Pietambaram | H01L 23/481 |
| 2020/0389172 | A1 | 12/2020 | Dabral et al. | |
| 2021/0091005 | A1 | 3/2021 | Tsai et al. | |
| 2021/0265275 | A1* | 8/2021 | Rubin | H01L 23/5381 |
| 2021/0280517 | A1 | 9/2021 | May et al. | |
| 2021/0366885 | A1 | 11/2021 | Chen et al. | |
| 2021/0391271 | A1* | 12/2021 | Hsu | H01L 25/16 |
| 2021/0391272 | A1* | 12/2021 | Tsai | H01L 23/5383 |
| 2021/0407962 | A1 | 12/2021 | Kim et al. | |
| 2022/0037276 | A1 | 2/2022 | Lee et al. | |
| 2022/0045008 | A1 | 2/2022 | Kang et al. | |
| 2023/0275078 | A1* | 8/2023 | Muljono | H01L 23/5283 257/784 |

* cited by examiner

SEMICONDUCTOR PACKAGE

CROSS-REFERENCE TO RELATED APPLICATION(S)

This application claims the benefit under 35 USC 119(a) of Korean Patent Application No. 10-2022-0086802, filed on Jul. 14, 2022 in the Korean Intellectual Property Office, the disclosure of which is incorporated herein by reference in its entirety.

BACKGROUND

The present inventive concept relates to a semiconductor package.

Semiconductor devices mounted on electronic devices are required to be miniaturized, as well as to have high performance and high capacity. For implementation thereof, a semiconductor package for interconnecting semiconductor chips stacked in a vertical direction using a through-electrode (e.g., through-silicon via) is being developed.

SUMMARY

Example embodiments provide a semiconductor package in which a process is simplified.

According to example embodiments, a semiconductor package includes a substrate including a first redistribution member including a first surface and a second surface opposing each other, and including a first redistribution layer, an interconnection chip below the second surface and including an interconnection circuit electrically connected to the first redistribution layer, a via structure disposed around the interconnection chip and electrically connected to the first redistribution layer, an encapsulant filling a space between the second surface and the interconnection chip and the via structure, a first pillar extending through the encapsulant to electrically connect the first redistribution layer and the interconnection circuit, a second pillar extending through the encapsulant to electrically connect the first redistribution layer and the via structure, and connection bumps below the interconnection chip and the via structures; and first and second chip structures on the first surface of the first redistribution member and electrically connected to the first redistribution layer. The first pillar and the second pillar have different shapes.

According to example embodiments, a semiconductor package includes a substrate including a first redistribution member including a first surface and a second opposite surface, and including a first redistribution layer, an interconnection chip below the second surface and including an interconnection circuit electrically connected to the first redistribution layer, a via structure disposed around the interconnection chip and electrically connected to the first redistribution layer, an encapsulant between the second surface of the first redistribution member and the interconnection chip and the via structure, a first pillar passing through the encapsulant to electrically connect the first redistribution layer and the interconnection circuit, a second pillar passing through the encapsulant to electrically connect the first redistribution layer and the via structure, and connection bumps below the interconnection chip and the via structures; and first and second chip structures on the first surface of the first redistribution member and electrically connected to the first redistribution layer. The first pillar and the second pillar have different heights.

According to example embodiments, a semiconductor package includes a first redistribution member including a first surface and an opposite second surface, and including a first redistribution layer; an interconnection chip below the second surface of the first redistribution member and including an interconnection circuit electrically connected to the first redistribution layer; a via structure disposed around the interconnection chip and electrically connected to the first redistribution layer; an encapsulant including a first portion disposed between the second surface of the first redistribution member and the interconnection chip and the via structure and a second portion disposed on a side surface of the interconnection chip; a first pillar extending through the first portion of the encapsulant and electrically connecting the first redistribution layer and the interconnection circuit; a second pillar extending through the first portion of the encapsulant and electrically connecting the first redistribution layer and the via structure, and including a tapered shape decreasing in width in a direction from the second surface of the first redistribution member toward the via structure; a second redistribution member below the interconnection chip and the via structure and including a second redistribution layer electrically connected to the via structure; connection bumps below the second redistribution member and electrically connected to the second redistribution layer; and first and second chip structures on the first surface of the first redistribution member and electrically connected to the first redistribution layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1A:
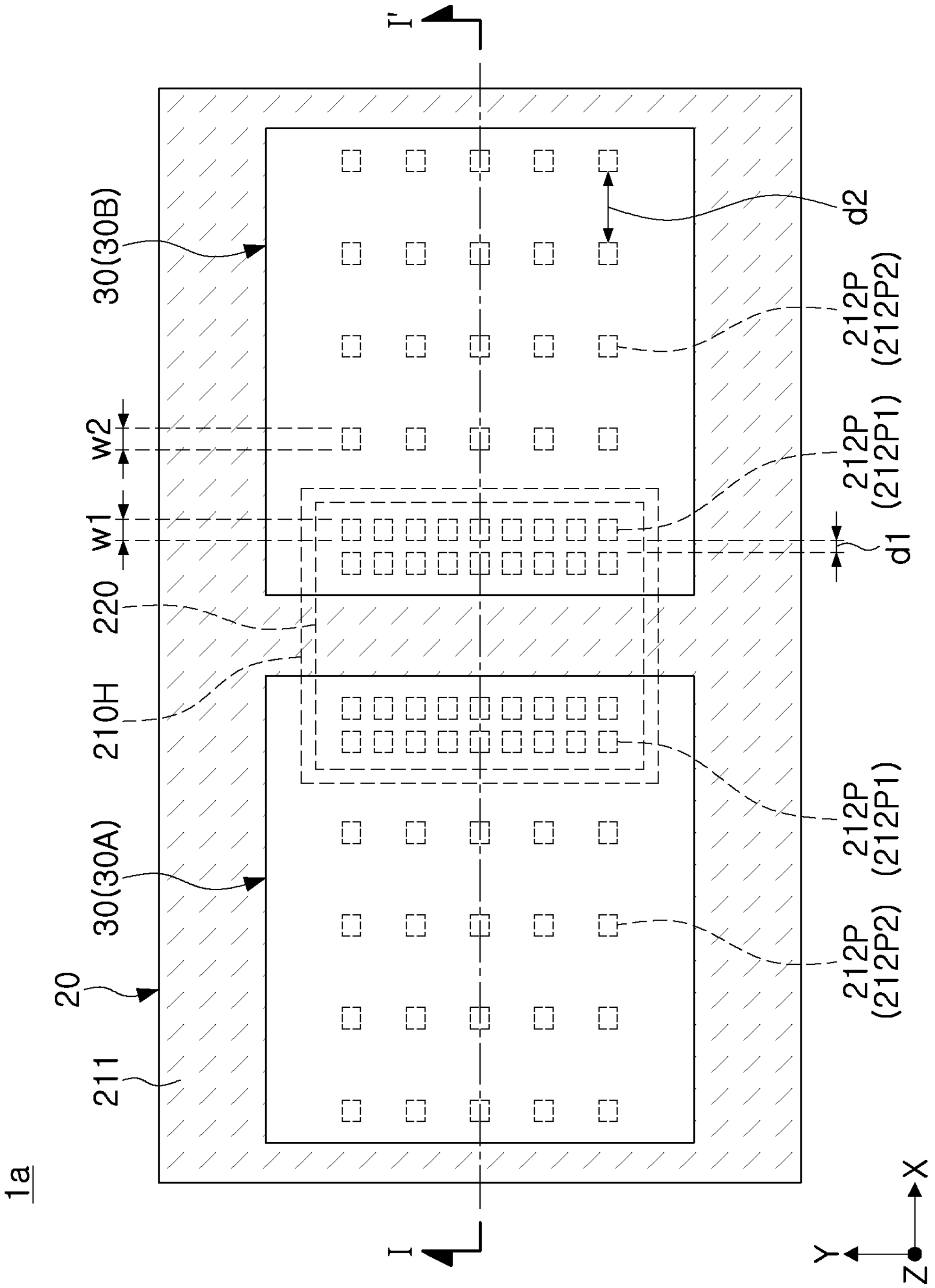
FIG. 1A is a plan view illustrating a semiconductor package according to an example embodiment.
Figure 1B:
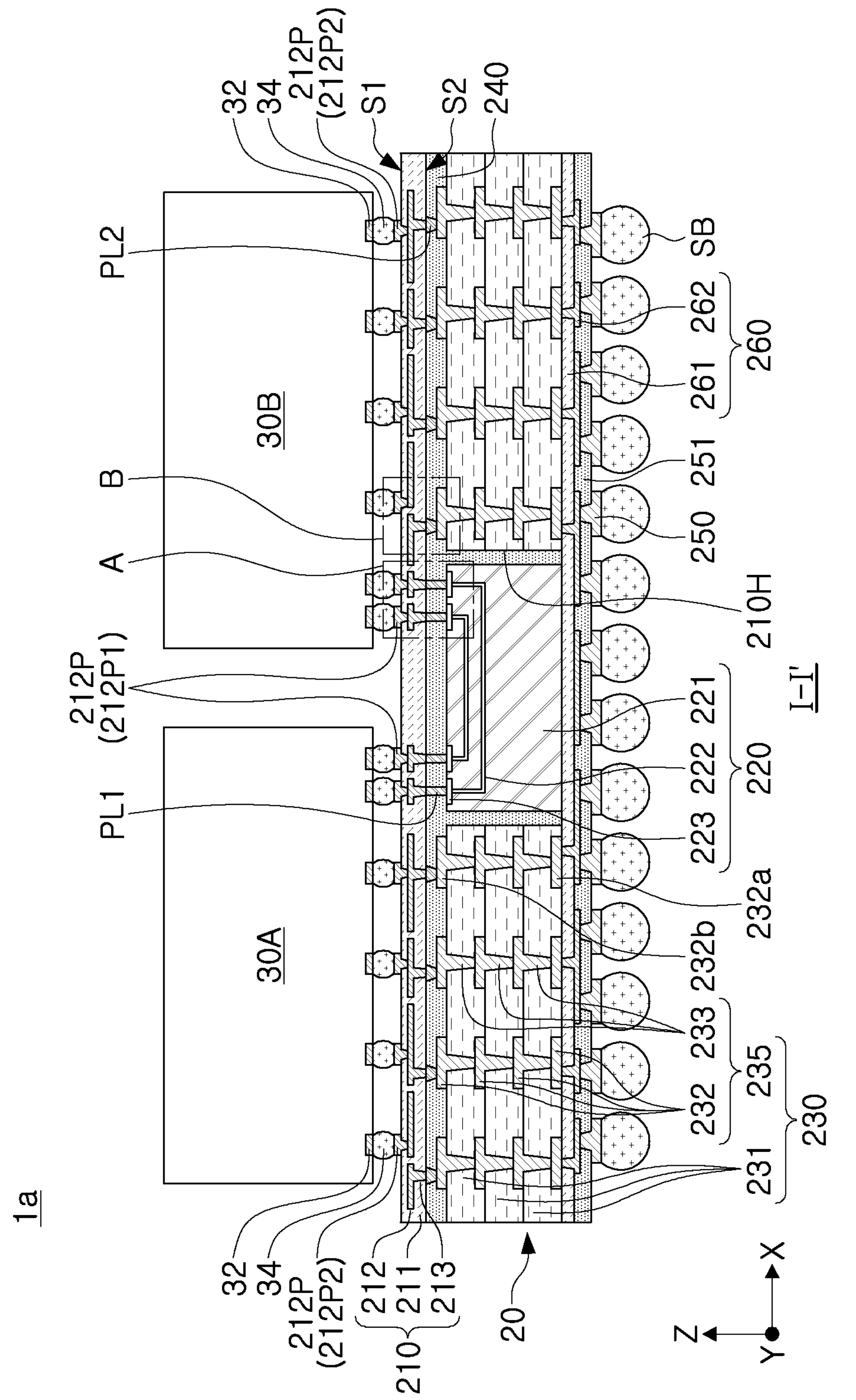
FIG. 1B is a cross-sectional view taken along line I-I' of FIG. 1A.
Figure 2:
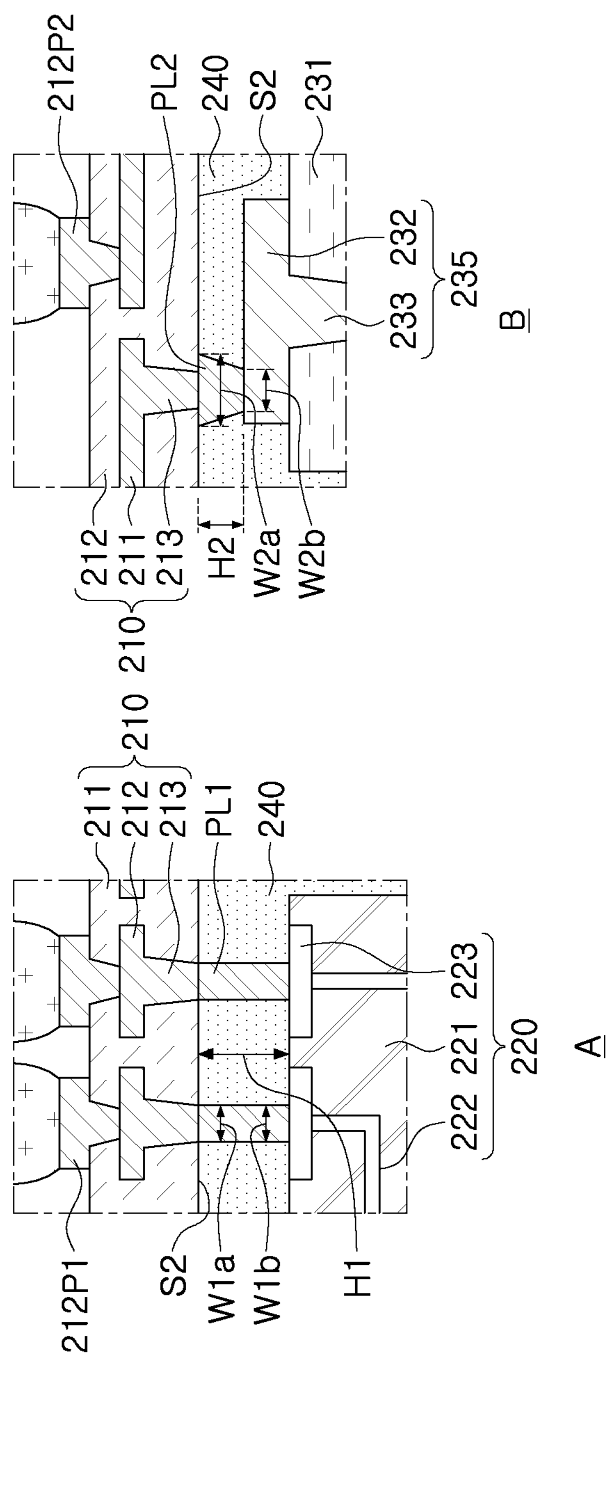
FIG. 2 is a partially enlarged view illustrating area 'A' and area 'B' of FIG. 1B.

FIG. 1A is a plan view illustrating a semiconductor package according to an example embodiment, FIG. 1B is a cross-sectional view illustrating taken along line I-I' of FIG. 1A, and FIG. 2 is a partially enlarged view illustrating areas ‘A’ and ‘B’ of FIG. 1B.

Referring to FIGS. 1A and 1B, a semiconductor package 1*a* according to an example embodiment may include a substrate 20 (or an ‘interposer substrate’) and chip structures 30. According to an example embodiment, by introducing pillar structures PL1 and PL2 between an interconnection chip 220 and between a redistribution member 210 and a via structure 235, the manufacturing process of the semiconductor package 1*a* may be simplified and the yield may be improved.

The substrate 20 may include a first redistribution member 210, the interconnection chip 220, a connection member 230, an encapsulant 240, and connection bumps 250. In some embodiments, the substrate 20 may further include a second redistribution member 260.

The first redistribution member 210 has a first surface S1 and a second surface S2 that are opposed to each other, and may include a first dielectric layer 211, a first redistribution layer 212, and a first redistribution via 213. Also, the redistribution member 210 (or the first redistribution layer 212) may include pad structures 212P disposed on the first surface S1.

The first dielectric layer 211 may include a thermosetting resin such as an epoxy resin, a thermoplastic resin such as polyimide, or a resin impregnated with an inorganic filler in these resins, for example, a prepreg, Ajinomoto build-up film (ABF), FR-4, Bismaleimide Triazine (BT), or a photosensitive resin such as Photo Imageable Dielectric (PID) resin. The first dielectric layer 211 may be formed of a plurality of layers, and a boundary between each layer may be clearly distinguished. However, depending on the process, the boundary between respective layers may be unclear.

The first redistribution layer 212 may electrically connect the interconnection chip 220, the via structure 235 and the chip structures 30. The first redistribution layer 212 may substantially redistribute pads 32 of the chip structures 30. For example, the pad 32 may be connected to the pad structures 212P through solder bumps 34. The first redistribution layer 212 may include a metal material that includes, for example, copper (Cu), aluminum (Al), silver (Ag), tin (Sn), gold (Au), nickel (Ni), lead (Pb), titanium (Ti) or alloys thereof. The first redistribution layer 212 may include a ground (GrouND: GND) pattern, a power (PoWeR: PWR) pattern, and a signal (S) pattern according to a design. The signal (S) pattern may provide a transmission path of various signals except for the ground (GND) pattern, the power (PWR) pattern, and the like.

The pad structures 212P may be disposed on the first surface S1, and may electrically connect the chip structures 30 and the first redistribution layer 212. The pad structures 212P may include a pad portion disposed on the first dielectric layer 211, and a via portion extending into the first dielectric layer 211 to connect the pad portion to the first redistribution layer 212. Also, the pad structures 212P may include a surface layer disposed on the pad portion. The surface layer may include nickel (Ni), gold (Au), or alloys thereof.

The pad structures 212P may include first pad structures 212P1 electrically connected to an interconnection circuit 222 through the first redistribution layer 212, and second pad structures 212P2 electrically connected to the via structure 235. The first pad structures 212P1 and the second pad structures 212P2 may be formed in the same manufacturing process, and may thus have substantially the same size. For example, a width w1 of the first pad structures 212P1 in a direction (X-direction) parallel to the first surface S1 may be substantially equal to a width w2 of the second pad structures 212P2.

The chip structures 30 may be electrically connected to each other through the first pad structures 212P1 and the interconnection circuit 222, and may be electrically connected to the connection bumps 250 through the second pad structures 212P2 and the via structure 235. Accordingly, the first pad structures 212P1 may be arranged at a fine pitch corresponding to the pitch of the pads 32 for interconnection of the chip structures 30. For example, a first distance or spacing d1 between the first pad structures 212P1 adjacent to each other may be smaller than a second distance or spacing d2 between the second pad structures 212P2 adjacent to each other. The first distance d1 may be about 60 μm or less, for example, in the range of about 10 μm to about 60 μm, about 20 μm to about 60 μm, about 20 μm to about 50 μm, or about 20 μm to about 40 μm, and the second distance d2 may be about 60 μm or greater, for example, in the range of about 60 μm to about 100 μm, or about 70 μm to about 100 μm.

The first redistribution via 213 may electrically connect the first redistribution layer 212 to the first pillar PL1 and the second pillar PL2. The first redistribution via 213 may include a metal material including, for example, copper (Cu), aluminum (Al), silver (Ag), tin (Sn), gold (Au), nickel (Ni), lead (Pb), titanium (Ti), or alloys thereof. The first redistribution via 213 may be a filled via in which a metal material is filled or a conformal via in which a metal material is formed along an inner wall of the via hole.

The interconnection chip 220 may be disposed on the second surface S2 of the first redistribution member 210, and may include a chip body 221, an interconnection circuit 222, and an interconnection pad 223. The interconnection chip 220 may have a size or a horizontal area in which a partial region of the chip body 221 may overlap or be aligned with the chip structures 30 in the vertical direction (Z-direction), for connection of the chip structures 30.

The chip body 221 may be formed based on ceramic, glass, semiconductor, or the like. For example, the chip body 221 may be formed based on an active wafer, and may include silicon (Si), germanium (Ge), gallium arsenide (GaAs), or the like. A passivation layer may be formed on one surface of the chip body 221 to protect the chip body 221 from external physical and chemical damage. The passivation layer may be formed of an oxide film or a nitride film, or may be formed of a double layer of an oxide film and a nitride film. For example, the passivation layer may be formed of a silicon oxide film (SiO), a silicon nitride film (SiN), or a combination thereof.

The interconnection circuit 222 may be formed in an interlayer insulating layer formed on one surface of the chip body 221. The interconnection circuit 222 may be electrically connected to the first pad structures 212P1 through the first pillar PL1 and the first redistribution layer 212, and may electrically connect the chip structures 30 to each other. The interconnection circuit 222 may have a finer pitch than a pitch of the first redistribution layer 212. The interconnection pad 223 may be disposed on or inside the interlayer insulating layer formed on one surface of the chip body 221 and may be in contact with the first pillar PL1.

The connection member 230 may include an insulating layer 231 and a via structure 235. The insulating layer 231 may surround or be on side surfaces of the via structure 235 and insulate the plurality of via structures 235 from each other. The connection member 230 may have a through-hole 210H penetrating through the insulating layer 231 and accommodating or receiving the interconnection chip 220. The through-hole 210H may have a shape that continuously surrounds the interconnection chip 220 on a plane (X-Y plane), but the present inventive concept is not limited thereto. The connection member 230 may improve the rigidity of the package and secure the thickness uniformity of the encapsulant 240 according to the material of the insulating layer 231.

The insulating layer 231 may include a thermosetting resin such as an epoxy resin, a thermoplastic resin such as polyimide, or a resin impregnated with an inorganic filler in these resins, for example, prepreg, ABF, FR-4, BT, or PID. The insulating layer 231 may be formed of a plurality of layers, and a boundary between respective layers may be clearly distinguished. However, depending on the process, the boundary between the layers may be unclear.

The via structure 235 may be disposed around the interconnection chip 220 and may be electrically connected to the first redistribution layer 212. The via structure 235 may have a form in which a plurality of conductive elements, for example, wiring layers 232 and vias 233 are vertically stacked. For example, a first wiring layer 232*a* may be buried in the insulating layer 231 and may include a bottom surface coplanar with a bottom surface of the interconnection chip 220. A second wiring layer 232*b* opposite to the first wiring layer 232*a* may protrude from the insulating layer 231. The wiring layers 232 and the vias 233 may include copper (Cu), aluminum (Al), silver (Ag), tin (Sn), gold (Au), nickel (Ni), lead (Pb), and titanium (Ti), or alloys thereof. The vias 233 may be filled-type vias filled with a metal material or conformal-type vias in which a metal material is formed along a wall surface of a via hole.

The encapsulant 240 may fill a space between the second surface S2 and the interconnection chip 220 and the via structure 235 and may seal at least a portion of each of the interconnection chip 220 and the via structure 235. For example, the encapsulant 240 may have a first portion filling between the first redistribution member 210, the interconnection chip 220 and the via structure 235, and a second portion covering the side surface of the interconnection chip 220. The encapsulant 240 may include, for example, a thermosetting resin such as an epoxy resin, a thermoplastic resin such as polyimide, or a resin impregnated with an inorganic filler in these resins, for example, a prepreg, ABF, FR-4, BT, Epoxy Molding Compound (EMC), or the like.

The pillar structures PL1 and PL2 may pass through a portion of the encapsulant 240 filling between the interconnection chip 220 and the via structure 235. The pillar structures PL1 and PL2 may include copper (Cu), aluminum (Al), silver (Ag), tin (Sn), gold (Au), nickel (Ni), lead (Pb), titanium (Ti), or alloys thereof.

Figure 9A:
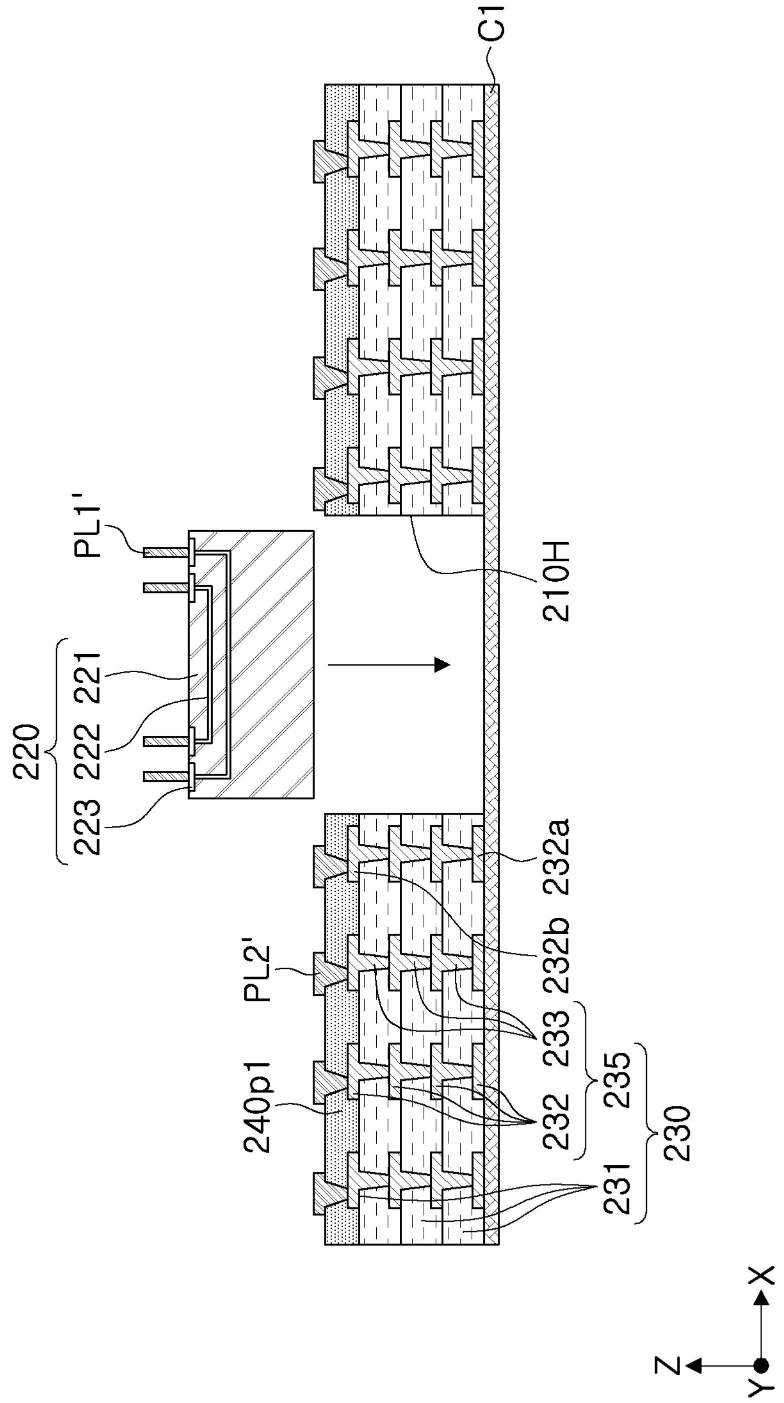
FIGS. 9A to 9E are cross-sectional views illustrating a manufacturing process of the semiconductor package of FIG. 1B.
Figure 9B:
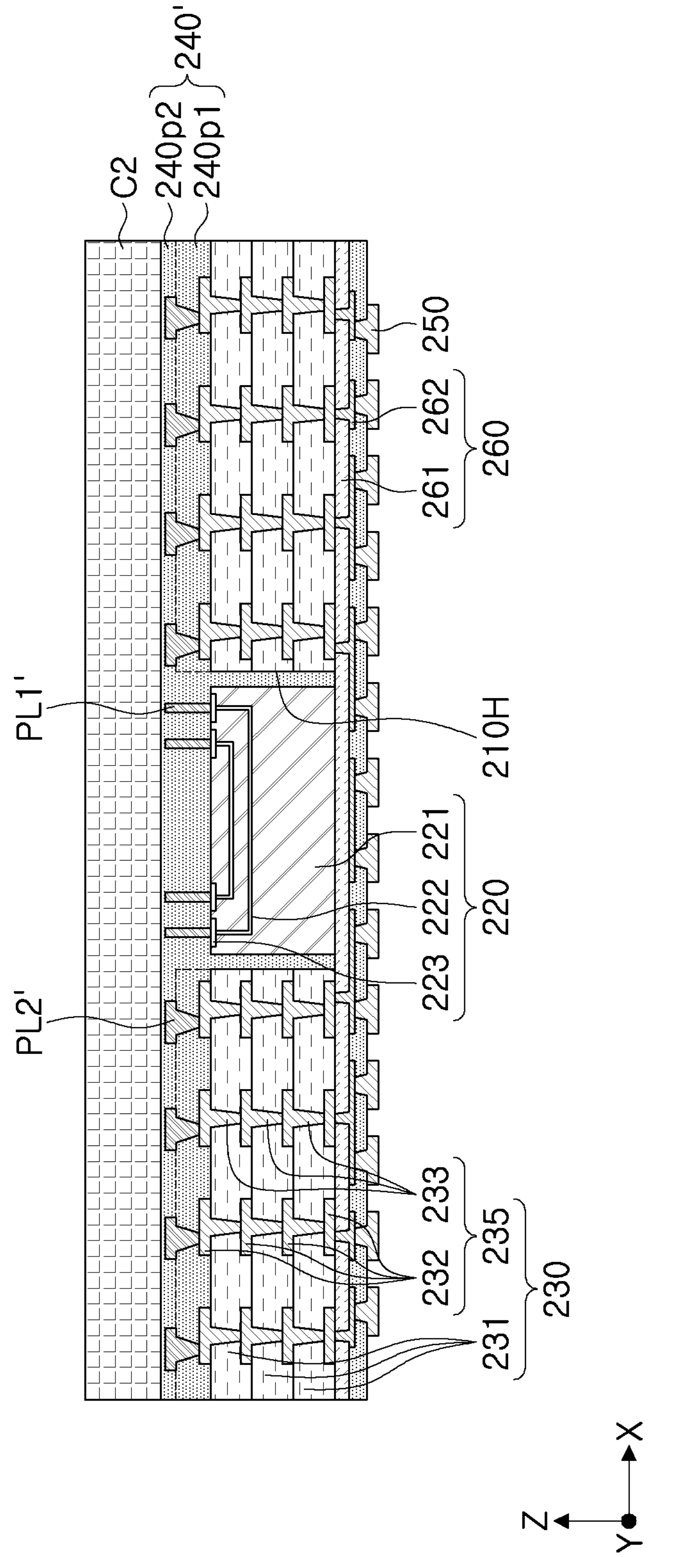
Figure 9C:
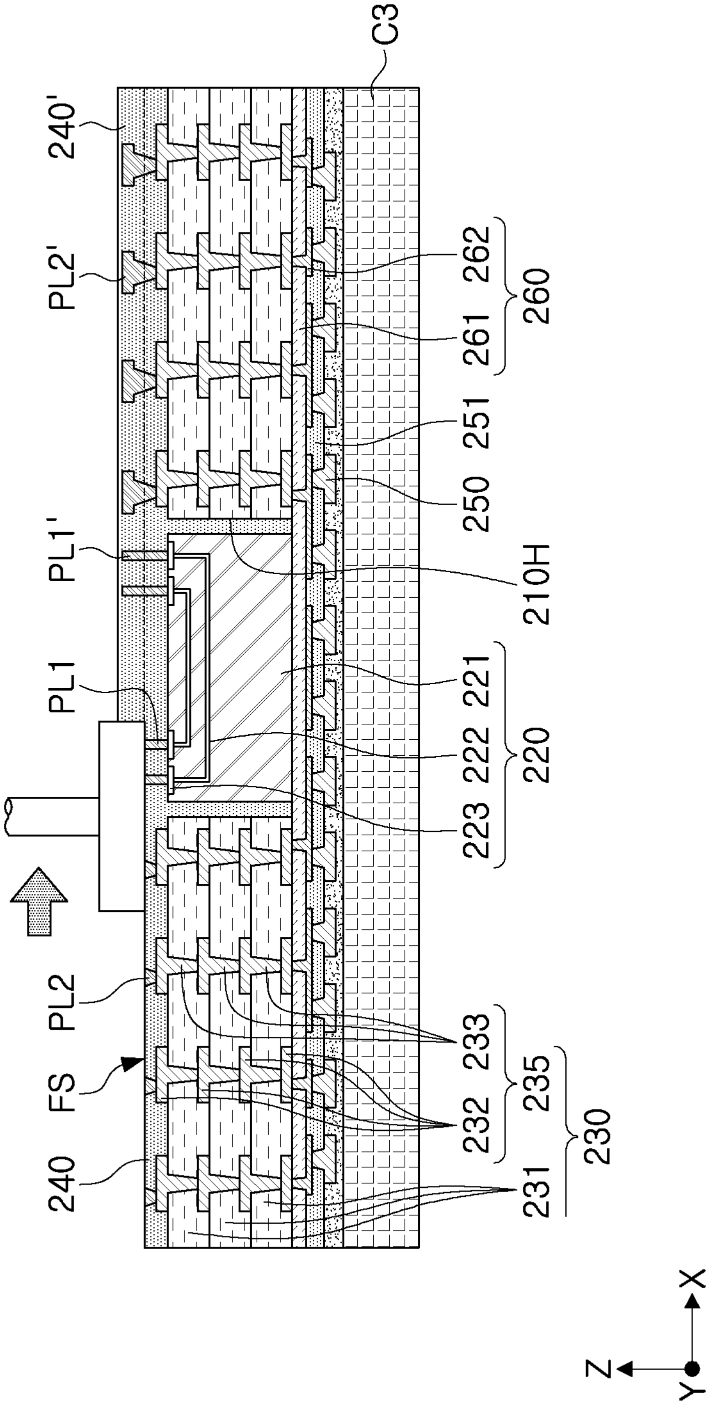

In an example embodiment of the present inventive concept, the pillar structures PL1 and PL2 are formed by grinding preliminary pillar structures formed on the interconnection chip 220 and the via structure 235 together with a preliminary encapsulant (see FIG. 9C). Accordingly, the upper surface of the first pillar PL1 may be substantially on the same surface as or coplanar with the upper surface of the second pillar PL2. As described herein, the pillar structures PL1 and PL2 exposed to the grinding surface may be formed without a laser process (a via hole forming process) of additionally processing the encapsulant 240 after the grinding process. Hereinafter, the pillar structures PL1 and PL2 will be described in detail with reference to FIG. 2.

Referring to FIG. 2, the pillar structures PL1 and PL2 may include a first pillar PL1 electrically connecting the first redistribution layer 212 and the interconnection circuit 222, and a second pillar PL2 electrically connecting the first redistribution layer 212 and the via structure 235.

The first pillar PL1 and the second pillar PL2 may have different shapes due to different introduction methods. The first pillar PL1 may be disposed in a position overlapping or aligned with the interconnection chip 220, for example, in a fan-in area. In the first pillar PL1, an upper width W1a adjacent to the second surface S2 of the first redistribution member 210 and a lower width W1b adjacent to the interconnection chip 220 may have substantially the same shape or size. The second pillar PL2 may be disposed in a position that does not overlap or align with the interconnection chip 220, for example, in a fan-out area. The second pillar PL2 may have a tapered shape decreasing in width towards the via structure 235. For example, in the second pillar PL2, an upper width W2a adjacent to the second surface S2 of the first redistribution member 210 may be greater than a lower width W2b adjacent to the via structure 235.

Also, the width of the upper surface of the second pillar PL2 in contact with the second surface S2 of the first redistribution member 210 may be greater than the width of the upper surface of the first pillar PL1 in contact with the second surface S2 of the first redistribution member 210.

Also, the second pillar PL2 may have a width greater than the width of the first redistribution via 213 in a direction parallel to the second surface S2 of the first redistribution member 210 (X-direction). For example, the width of the lower surface of the second pillar PL2 in contact with the via structure 235 may be greater than the width of the lower surface of the first redistribution via 213 in contact with the second pillar PL2.

Also, the first pillar PL1 and the second pillar PL2 may have different heights. For example, in the direction (Z-direction) perpendicular to the second surface S2 of the first redistribution member 210, the second pillar PL2 may have a second height H2 less than a first height H1 of the first pillar PL1.

Referring again to FIGS. 1A and 1B, the connection bumps 250 may be disposed below the interconnection chip 220 and the via structures 235. The connection bumps 250 may be connected to the chip structures 30 through the via structure 235, and may electrically connect the same to an external device such as a module substrate or a system board. The connection bumps 250 may be formed on the passivation or protective layer 251. The protective layer 251 may be formed of an insulating resin such as ABF. According to an example embodiment, the protective layer 251 may cover at least a portion of side surfaces and/or lower surfaces of the connection bumps 250. Below the connection bumps 250, solder bumps SB formed of, for example, tin (Sn), indium (In), bismuth (Bi), antimony (Sb), copper (Cu), silver (Ag), zinc (Zn), lead (Pb), or alloys thereof (e.g., Sn—Ag—Cu) may be disposed.

The second redistribution member 260 may include a second dielectric layer 261 disposed below the interconnection chip 220 and the via structures 235, and a second redistribution layer 262 electrically connected to the via structures 235. The connection bumps 250 may be disposed below the second redistribution member 260. The second dielectric layer 261 may include a photosensitive resin such as PID. The second dielectric layer 261 may be formed in a greater number than illustrated in the drawings, and the boundary between the respective layers may be clear or unclear depending on the process.

The second redistribution layer 262 may electrically connect the via structure 235 and the connection bumps 250.

The second redistribution layer 262 may include a metal material including, for example, copper (Cu), aluminum (Al), silver (Ag), tin (Sn), gold (Au), nickel (Ni), lead (Pb), titanium (Ti), or alloys thereof. The second redistribution layer 262 may be connected to the via structure 235 through a second redistribution via penetrating through the second dielectric layer 261.

The chip structures 30 may be disposed to be spaced apart from each other in a horizontal direction (X-direction or Y-direction) on the substrate 20. The chip structures 30 may be electrically connected to each other via the interconnection circuit 222. Each of the chip structures 30 may at least partially overlap or align with the interconnection chip 220 in the vertical direction (Z-direction) perpendicular to the substrate 20. For example, the chip structures 30 may include a first chip structure 30A and a second chip structure 30B disposed on the first surface 51 of the first redistribution member 210 and overlapping at least a portion of the interconnect chip 220, respectively.

The first chip structure 30A and the second chip structure 30B may include a logic chip (or a processor chip) such as a central processor (CPU), a graphics processor (GPU), a field programmable gate array (FPGA), an application processor (AP), a digital signal processor, a cryptographic processor, a microprocessor, a microcontroller, an analog-to-digital converter, an application-specific IC (ASIC), an application processor (AP), and a memory chip that includes a volatile memory such as a dynamic RAM (DRAM), a static RAM (SRAM) and the like, and a nonvolatile memory such as a phase change RAM (PRAM), a magnetic RAM (MRAM), a resistive RAM (RRAM), a flash memory or the like.

According to an example embodiment, the first chip structure 30A and the second chip structure 30B may include different types of semiconductor chips. For example, the first chip structure 30A may include a logic chip such as a CPU, a GPU, or an ASIC, and the second chip structure 30B may include a memory chip such as a DRAM or a flash memory.

Figure 3:
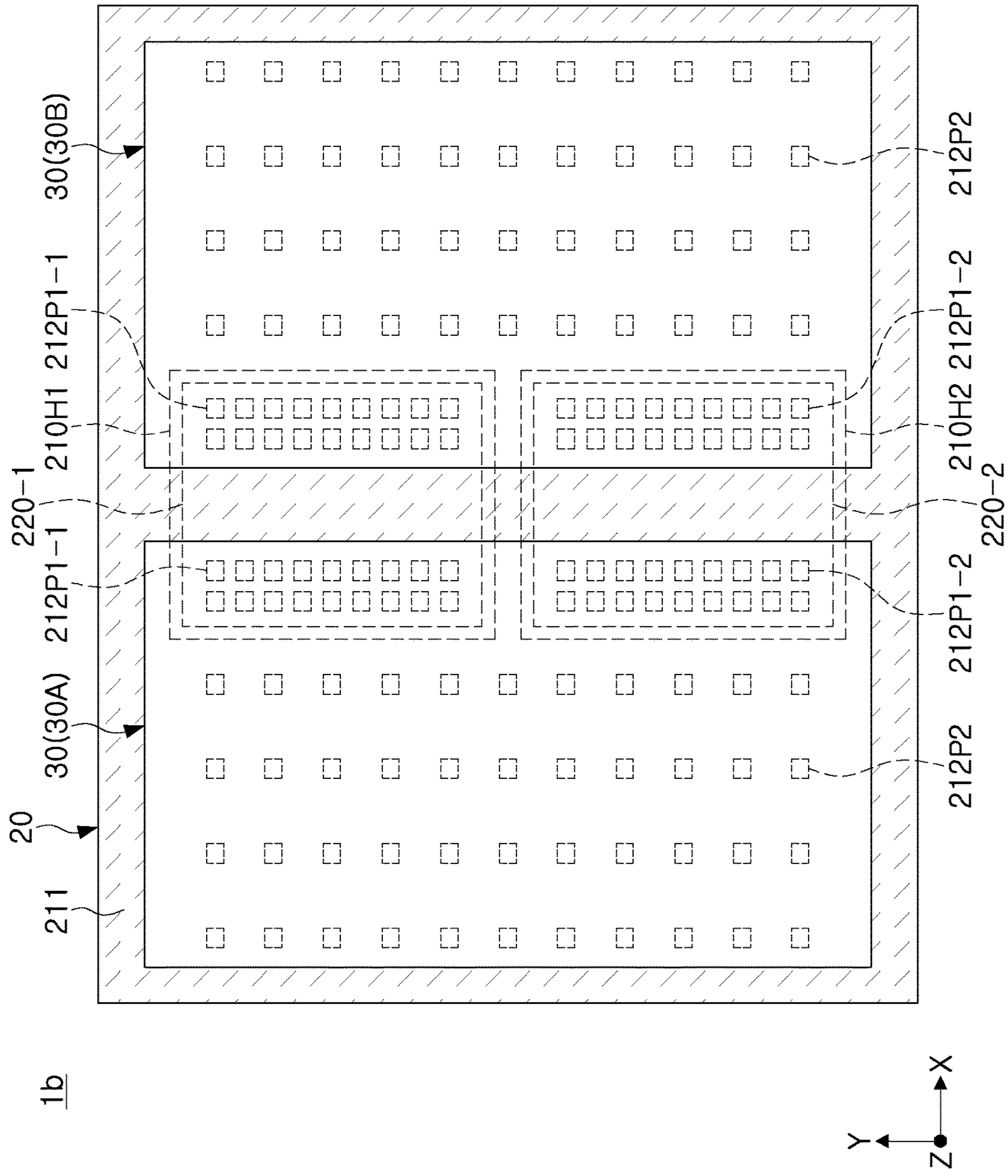
FIG. 3 is a plan view illustrating a semiconductor package according to an example embodiment.

FIG. 3 is a plan view illustrating a semiconductor package 1*b* according to an example embodiment.

Referring to FIG. 3, the semiconductor package 1*b* according to an example embodiment may have the same or similar characteristics as those described with reference to FIGS. 1A to 2, except that it includes a plurality of interconnection chips 220-1 and 220-2.

The semiconductor package 1*b* of the present embodiment includes the plurality of interconnection chips 220-1 and 220-2 at least partially overlapping the first chip structure 30A and the second chip structure 30B, respectively, and the substrate 20 may have a plurality of through-holes 210H1 and 210H2 accommodating the plurality of interconnection chips 220-1 and 220-2, respectively. The shape, relative size, and arrangement of the first chip structure 30A, the second chip structure 30B, and the plurality of interconnection chips 220-1 and 220-2 may be variously modified according to the design.

For example, the substrate 20 may include a first interconnection chip 220-1 disposed in the first through-hole 210H1 and a second interconnection chip 220-2 disposed in the second through-hole 210H2. The first chip structure 30A and the second chip structure 30B may be mounted on the substrate 20 to at least partially vertically overlap or align with the first interconnection chip 220-1 and the second interconnection chip 220-2, respectively. The first chip structure 30A and the second chip structure 30B may be electrically connected through the first interconnection chip 220-1 and the second interconnection chip 220-2.

Figure 4A:
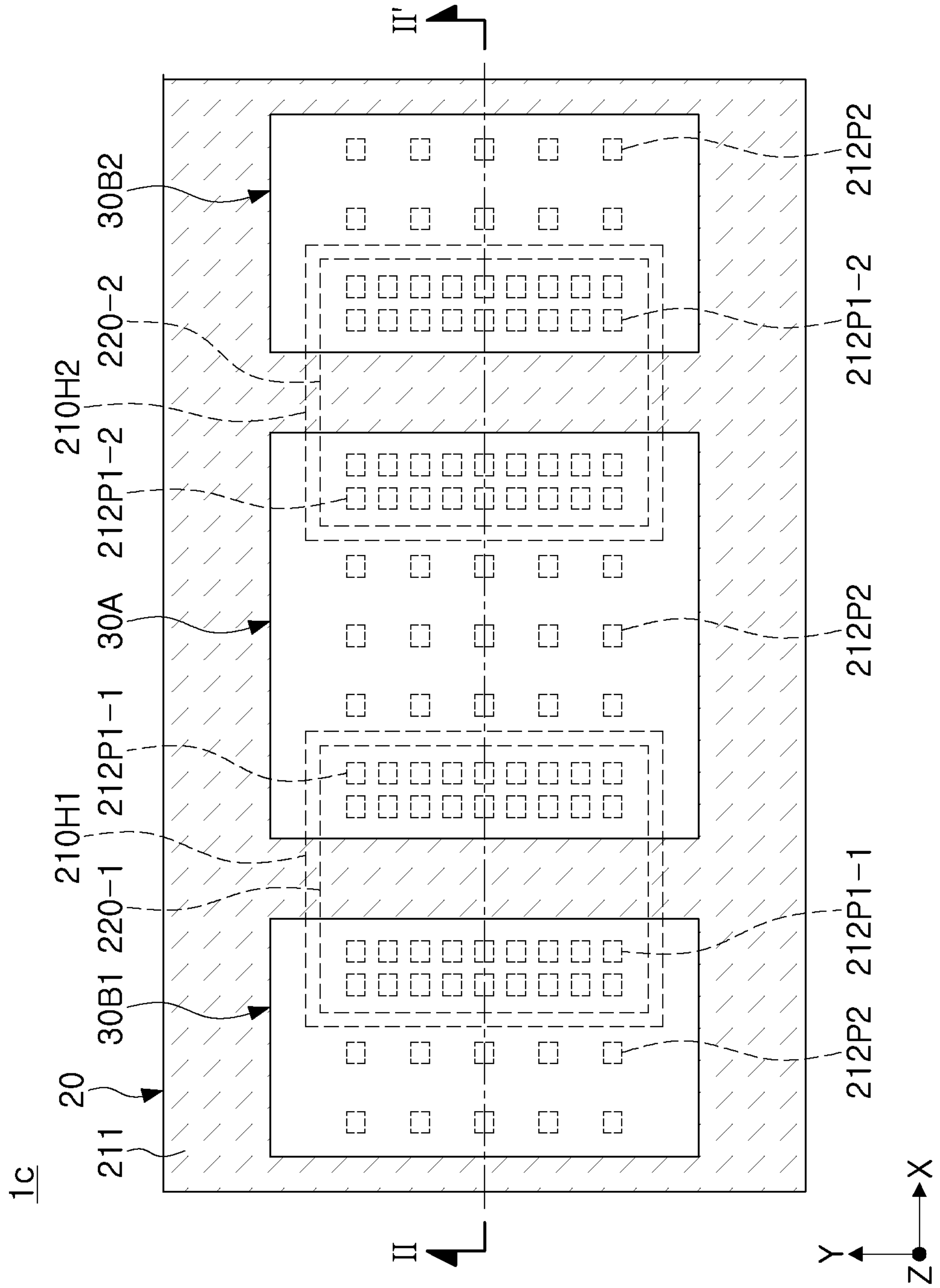
FIG. 4A is a plan view illustrating a semiconductor package according to an example embodiment.
Figure 4B:
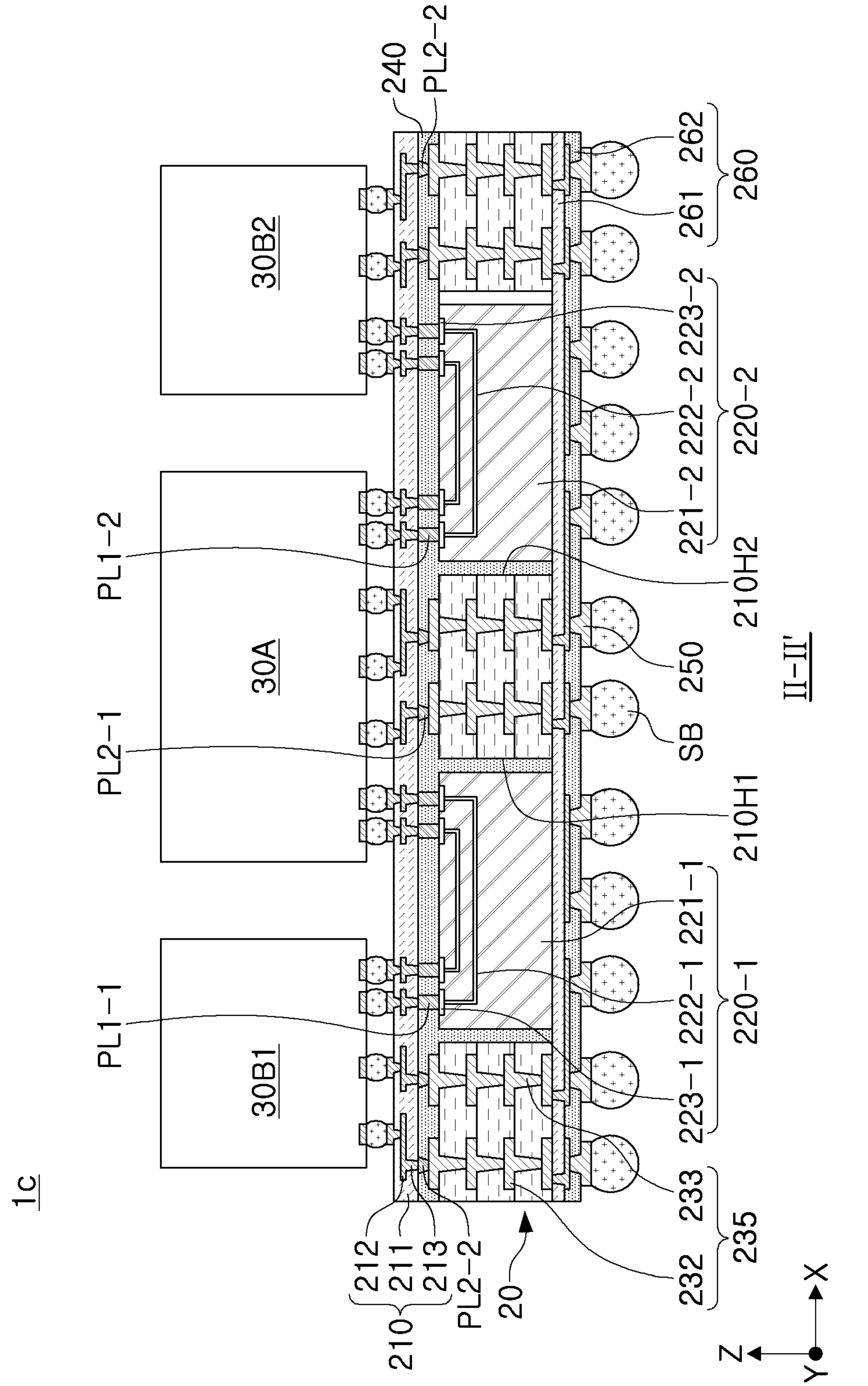
FIG. 4B is a cross-sectional view illustrating a cross-section II-II' of FIG. 4A.

FIG. 4A is a plan view illustrating a semiconductor package 1*c* according to an example embodiment, and FIG. 4B is a cross-sectional view illustrating a cross section taken along line II-II' of FIG. 4A.

Referring to FIGS. 4A and 4B, the semiconductor package 1*c* according to an example embodiment may have the same or similar characteristics as those described with reference to FIGS. 1A to 3.

The semiconductor package 1*c* according to an example embodiment may have the same or similar characteristics as those described with reference to 1A to 3, except that it includes a plurality of second chip structures 30B1 and 30B2 disposed on the periphery of the first chip structure 30A.

The semiconductor package 1*c* of the present embodiment may include the plurality of second chip structures 30B1 and 30B2 disposed around the first chip structure 30A, and the substrate 20 may include the plurality of interconnection chips 220-1 and 220-2 respectively electrically connecting the plurality of second chip structures 30B1 and 30B2 to the first chip structure 30A.

The first chip structure 30A may be connected to the first interconnection chip 220-1 through a pillar PL1-1, and may be connected to the via structure 235 through a pillar PL2-1. The second chip structure 30B1 may be connected to the first interconnection chip 220-1 through the pillar PL1-1, and may be connected to the via structure 235 through a pillar PL2-2. The second chip structure 30B2 may be connected to the second interconnection chip 220-2 through a pillar PL1-2, and may be connected to the via structure 235 through the pillar PL2-2.

The substrate 20 may have a plurality of through-holes 210H1 and 210H2 accommodating the plurality of interconnection chips 220-1 and 220-2, respectively. For example, the substrate 20 may include a first interconnection chip 220-1 disposed in the first through-hole 210H1 and a second interconnection chip 220-2 disposed in the second through-hole 210H2. The first chip structure 30A, the second chip structure 30B1 and the second chip structure 30B2 may be mounted on the substrate 20 to at least partially overlap the first interconnection chip 220-1 and the second interconnection chip 220-2 respectively.

The plurality of second chip structures 30B1 and 30B2 may be spaced apart from each other in a horizontal direction (e.g., an X-direction). The first chip structure 30A may be disposed between the plurality of second chip structures 30B1 and 30B2 spaced apart from each other, but the arrangement relationship of the first chip structure 30A and the plurality of second chip structures 30B1 and 30B2 is not limited thereto. In a plan view, the plurality of second chip structures 30B1 and 30B2 may be disposed adjacent to the left and right surfaces of the first chip structure 30A as well as upper and lower surfaces of the first chip structure 30A. The first chip structure 30A and the plurality of second chip structures 30B1 and 30B2 may be provided in a greater number than illustrated in the drawings, and the number of the interconnection chips may be increased correspondingly.

Figure 5:
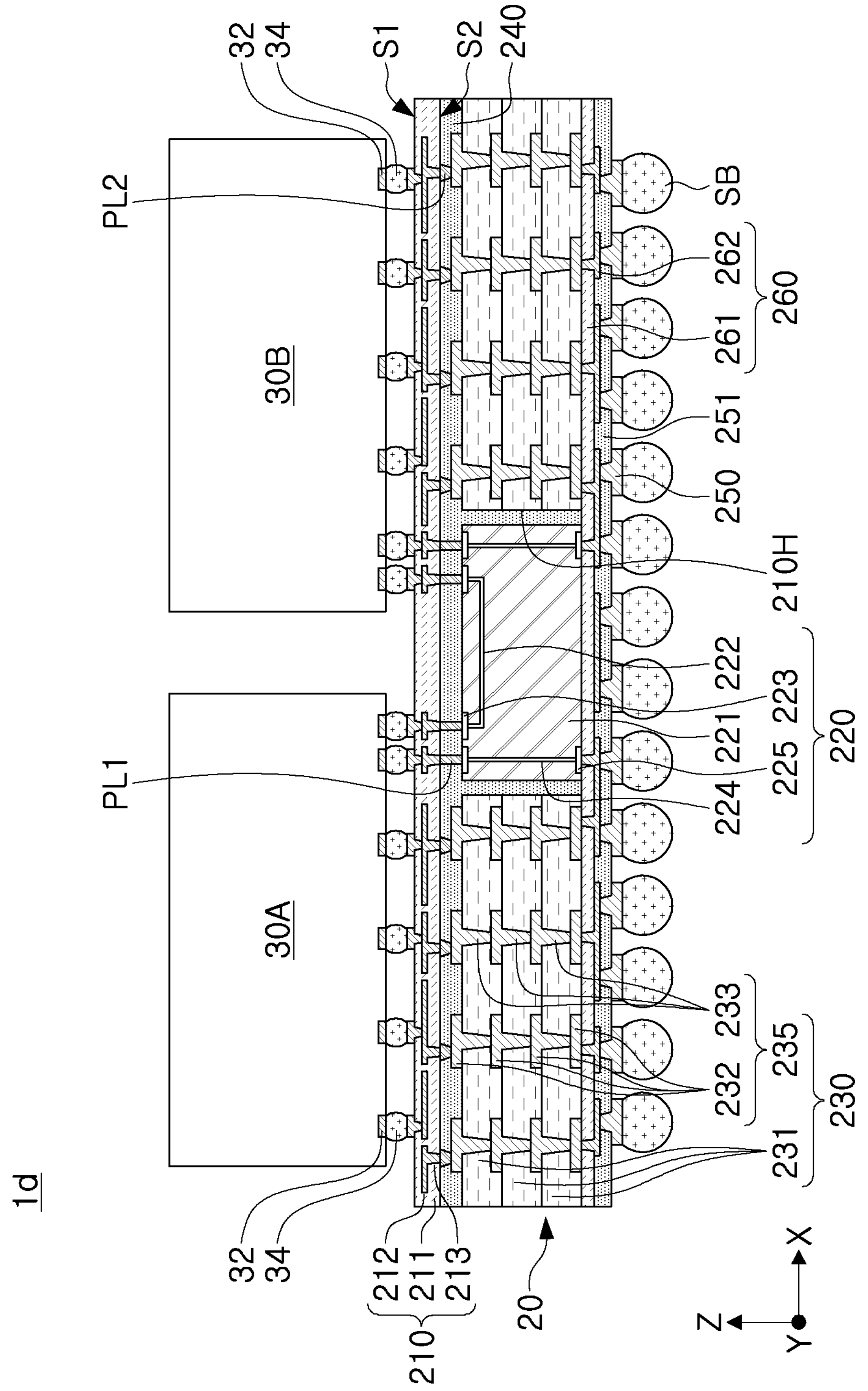
FIG. 5 is a cross-sectional view illustrating a semiconductor package according to an example embodiment.

FIG. 5 is a cross-sectional view illustrating a semiconductor package 1*d* according to an example embodiment.

Referring to FIG. 5, the semiconductor package 1*d* of an example embodiment may have the same or similar features as those described with reference to FIGS. 1A to 4, except that it includes a through-via 224 penetrating through the interconnection chip 220.

The interconnection chip 220 of this embodiment may include the through-via 224 and a back pad 225. The through-via 224 may electrically connect the interconnect pad 223 and the back pad 225. The through-via 224 may be a through-silicon via (TSV) passing through the chip body 221. According to an example embodiment, the interconnection circuit 222 or the first and second chip structures 30A and 30B may be electrically connected to the second redistribution layer 262 through the through-via 224.

Figure 6:
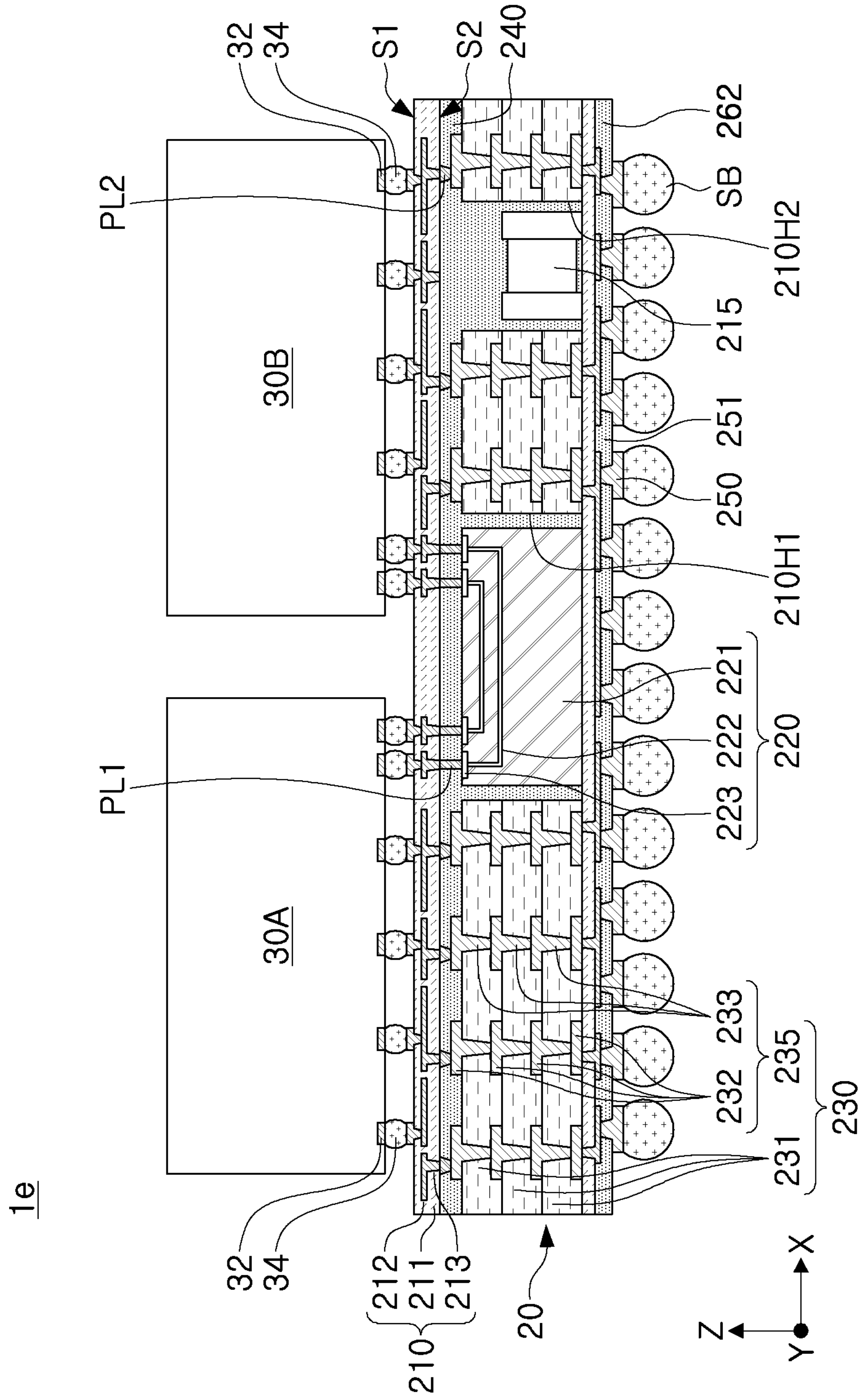
FIG. 6 is a cross-sectional view illustrating a semiconductor package according to an example embodiment.

FIG. 6 is a cross-sectional view illustrating a semiconductor package 1*e* according to an example embodiment.

Referring to FIG. 6, the semiconductor package 1*e* according to an example embodiment may have the same or similar characteristics as those described with reference to FIGS. 1A to 5, except that the semiconductor package 1*e* further includes a passive component 215 embedded in the substrate 20.

The substrate 20 of this embodiment may include at least one passive component 215 disposed around the interconnection chip 220 and electrically connected to the second redistribution layer 262. The passive component 215 may be electrically connected to the first chip structure 30A and the second chip structure 30B through the second redistribution layer 262 and the via structure 235. For example, the connection member 230 may have the second through-hole 210H2 for receiving the passive component 215. The second through-hole 210H2 may be spaced apart from the first through-hole 210H1 accommodating the interconnection chip 220. The passive component 215 may include a capacitor such as a Multi Layer Ceramic Capacitor (MLCC) or a Low Inductance Chip Capacitor (LICC), an inductor such as a chip inductor, a power inductor, beads, and the like. The number of passive components 215 is not particularly limited, and may be provided in a number greater than that illustrated in the drawings.

Figure 7:
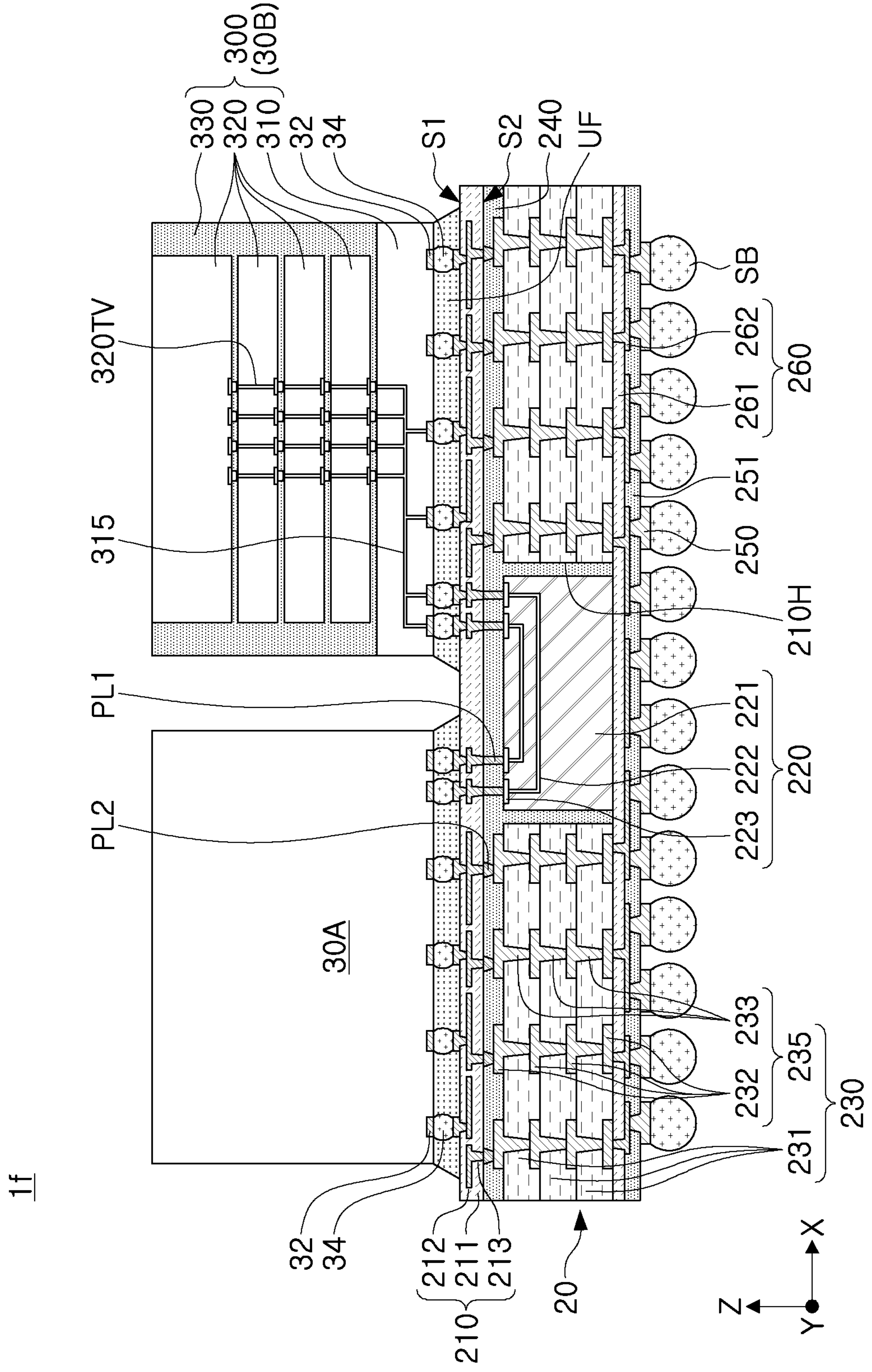
FIG. 7 is a cross-sectional view illustrating a semiconductor package according to an example embodiment.

FIG. 7 is a cross-sectional view illustrating a semiconductor package if according to an example embodiment.

Referring to FIG. 7, the semiconductor package 1*f* according to an example embodiment may have the same or similar characteristics as those described with reference to FIGS. 1A to 6, except that the second chip structure 30B is provided as a high-capacity memory device 300. In some embodiments, an underfill layer UF may be formed below the first chip structure 30A and the second chip structure 30B. The underfill layer UF may be formed in the form of a capillary underfill (CUF) or a molded underfill (MUF).

In this embodiment, the first chip structure 30A may be a logic chip including an ASIC or the like, and the second chip structure 30B may be a high-capacity memory device 300 including a plurality of memory chips 320, for example, including a High Bandwidth Memory (HBM) or Electro Data Processing (EDP) device. For example, the memory device 300 may include a base chip 310, a memory chip 320, and a molded layer 330.

The base chip 310 may be a control chip or a buffer chip including a plurality of logic devices and/or memory devices. The base chip 310 may transmit signals from the memory chips 320 externally, and may also transmit signals and power from the outside to the memory chips 320.

The memory chips 320 may be memory chips including volatile memory devices such as DRAM and SRAM or non-volatile memory devices such as PRAM, MRAM, FeRAM, RRAM, and flash memory. The memory chips 320 may be electrically connected to each other through a through-electrode 320TV. However, an uppermost memory chip 320 may not include the through-electrode 320TV and may have a relatively greater thickness.

The molded layer 330 may be disposed on the base chip 310 and may encapsulate at least a portion of each of the memory chips 320. The molded layer 330 may be formed to expose an upper surface of the uppermost memory chip 320. The molded layer 330 may be formed using, for example, EMC, but the material of the molded layer 33 is not particularly limited.

Figure 8:
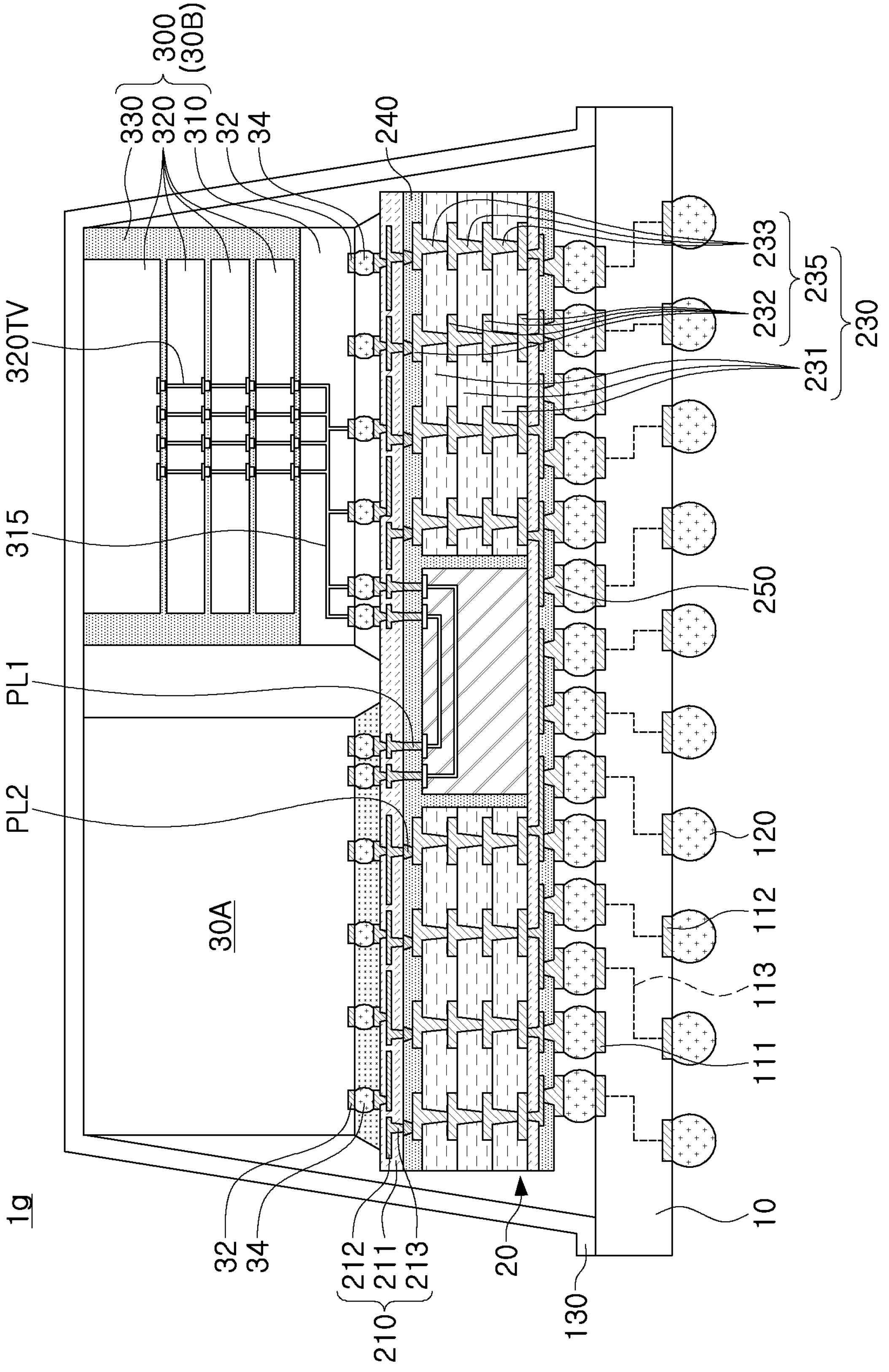
FIG. 8 is a cross-sectional view illustrating a semiconductor package according to an example embodiment.

FIG. 8 is a cross-sectional view illustrating a semiconductor package 1*g* according to an example embodiment.

Referring to FIG. 8, the semiconductor package 1*g* according to an example embodiment may have the same or similar characteristics as those described with reference to FIGS. 1A to 7, except that it further includes a base substrate 10 and a heat dissipation structure 130.

The semiconductor package 1*g* of the present embodiment may include a base substrate 10, a substrate (or interposer substrate) 20, and chip structures 30A and 30B.

The base substrate 10 may be a support substrate on which the interposer substrate 20 is mounted, and may be a substrate for a semiconductor package, such as a printed circuit board (PCB), a ceramic substrate, or a tape wiring board. The base substrate 10 may include a lower pad 112 disposed on the lower surface, an upper pad 111 disposed on the upper surface, and a wiring circuit 113 electrically connecting the lower pad 112 and the upper pad 111. The body of the base substrate 10 may include a different material depending on the type of the substrate. For example, when the base substrate 10 is a printed circuit board, the body may be in the form of a copper clad laminate or in a form in which a wiring layer is additionally laminated on one surface or both surfaces of the copper clad laminate. An external connection bump 120 connected to the lower pad 112 may be disposed on the lower surface of the base substrate 10. The external connection bump 120 may include tin (Sn), indium (In), bismuth (Bi), antimony (Sb), copper (Cu), silver (Ag), zinc (Zn), lead (Pb) and/or alloys thereof.

The heat dissipation structure 130 may be disposed on the upper surface of the base substrate 10 and may be formed to cover upper portions of the chip structures 30A and 30B. The heat dissipation structure 130 may be attached to the base substrate 10 by an adhesive. The adhesive may be a thermally conductive adhesive tape, thermally conductive grease, thermally conductive adhesive, or the like. A thermal interface material layer may be disposed between the heat dissipation structure 130 and the chip structures 30A and 30B. The heat dissipation structure 130 may include a material having excellent thermal conductivity, for example, a metal or a metal alloy including gold (Au), silver (Ag), copper (Cu), iron (Fe) or the like, or a material such as graphite, graphene or the like. The heat dissipation structure 130 may have a shape different from the shape illustrated in the drawings. For example, the heat dissipation structure 130 may have a plate shape covering only the upper layers or upper surfaces of the chip structures 30A and 30B.

FIGS. 9A to 9E are cross-sectional views illustrating a manufacturing process of the semiconductor package 1*a* of FIG. 1B.

Referring to FIG. 9A, first, the connection member 230 in which the via structure 235 and a second preliminary pillar PL2' are formed may be attached to a first carrier C1.

The first carrier C1 may include, for example, an adhesive tape that loses adhesiveness due to ultraviolet (UV) irradiation. The via structure 235 may have a form in which wiring layers 232 and vias 233 are stacked. The connection member 230 may have a through-hole 210H in which the interconnection chip 220 is accommodated. The through-hole 210H may be formed by removing a portion of the insulating layer 231 using a laser drill. The connection member 230 may be disposed such that the first wiring layer 232*a* buried in the insulating layer 231 faces downward.

The second preliminary pillar PL2' may penetrate a first preliminary encapsulant layer 240*p*1 covering the upper portion of the via structure 235 to contact the via structure 235. The second preliminary pillar PL2' may include a via portion penetrating through the first preliminary encapsulant layer 240*p*1, and a pad portion protruding onto the first preliminary encapsulant layer 240*p*1. The first preliminary encapsulant layer 240*p*1 may be formed of an insulating resin such as ABF. The second preliminary pillar PL2' may be formed by a plating process and may include copper (Cu) or a copper (Cu) alloy.

Next, the interconnection chip 220 on which the first preliminary pillar PL1' is formed may be attached to the first carrier C1. The interconnection chip 220 may be disposed in the through-hole 210H of the connection member 230. The interconnection chip 220 may be disposed such that the interconnection pad 223 and the first preliminary pillar PL1' face upward. The first preliminary pillar PL1' may be formed in a post shape on the interconnection pad 223. The first preliminary pillar PL1' may include copper (Cu) or a copper (Cu) alloy.

Referring to FIG. 9B, a preliminary encapsulant 240' may be formed using a second carrier C2 on which a second preliminary encapsulant layer 240*p*2 is formed.

The second carrier C2 may include, for example, a copper clad laminate (CCL). The second preliminary encapsulant layer 240*p*2 may include the same material as the first preliminary encapsulant layer 240*p*1, for example, ABF. The second preliminary encapsulant layer 240*p*2 may cover the first preliminary pillar PL1' and the second preliminary pillar PL2', and may be filled between the interconnection chip 220 and the connection member 230. Depending on the process, the boundary between the first preliminary encapsulant layer 240*p*1 and the second preliminary encapsulant layer 240*p*2 may not be clearly distinguished.

Thereafter, the first carrier C1 may be removed, and the second redistribution member 260 and the connection bumps 250 may be formed. The second redistribution member 260 may be formed on the interconnection chip 220 and the via structure 235 exposed by removing the first carrier C1. The second redistribution member 260 may include a second dielectric layer 261 and a second redistribution layer 262. The second dielectric layer 261 may be formed by coating and curing a photosensitive resin such as PID. The second redistribution layer 262 may be formed using a photolithography process, a plating process, or the like.

Referring to FIG. 9C, the second carrier C2 is removed, and a planarization process may be applied to the upper portion of the preliminary encapsulant 240'. In the planarization process and subsequent processes, the second redistribution member 260 may be attached to the third carrier C3 to support and fix the interconnection chip 220, the connection member 230, and the like. The planarization process may include a grinding process, a chemical mechanical polishing (CMP) process, and the like. A portion of each of the first preliminary pillar PL1' and the second preliminary pillar PL2' is removed by the planarization process, and the first pillar PL1 and the second pillar PL2 exposed to a flat surface FS of the encapsulant 240 may be formed. Accordingly, the upper surface of the first pillar PL1, the upper surface of the second pillar PL2, and the upper surface of the encapsulant 240 may be substantially coplanar.

Figure 9D:
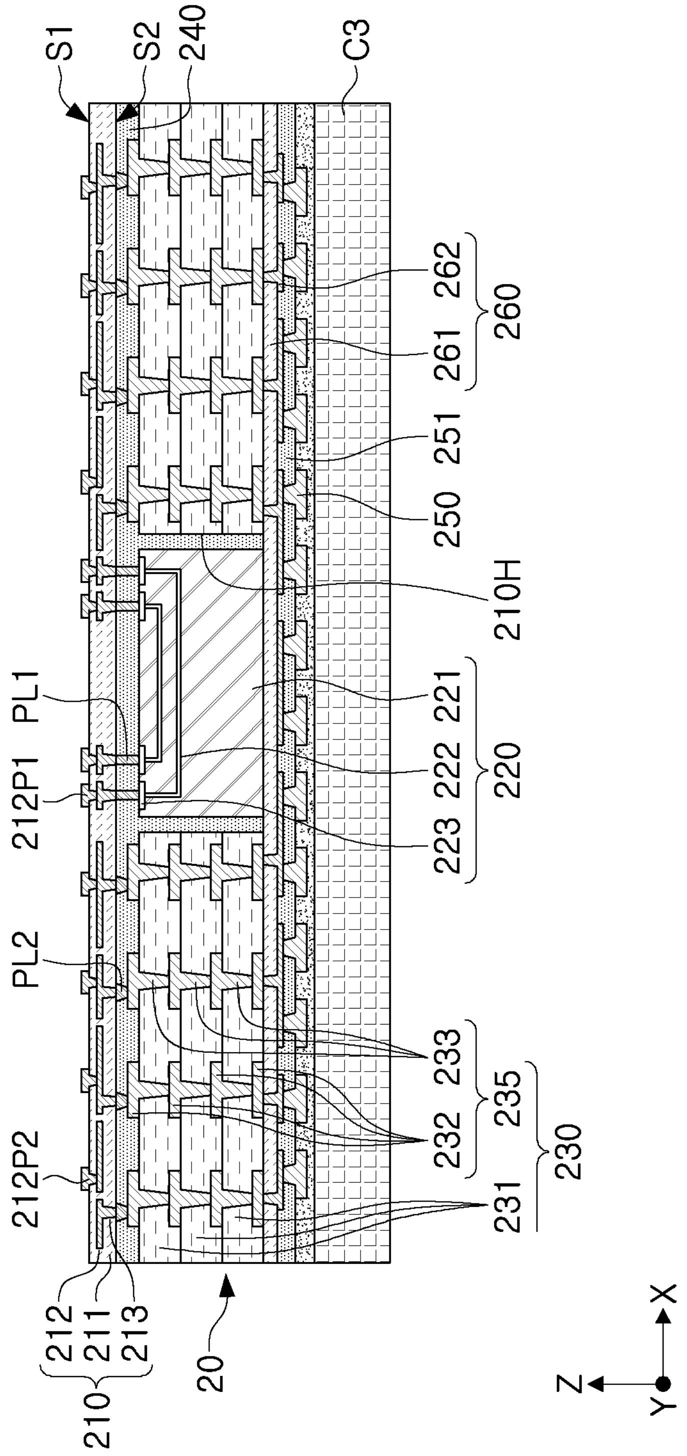

Referring to FIG. 9D, the first redistribution member 210 may be formed on the flat surface of the encapsulant 240 to which the grinding process is applied. The first redistribution member 210 may include a first dielectric layer 211, a first redistribution layer 212, a first redistribution via 213, and first and second pad structures 212P1 and 212P2. The first dielectric layer 211 may be formed by coating and curing a photosensitive resin such as PID. The first redistribution layer 212, the first redistribution via 213, and the first and second pad structures 212P1 and 212P2 may be formed using a photolithography process, a plating process, or the like. The first redistribution via 213 may contact the first pillar PL1 and the second pillar PL2.

Figure 9E:
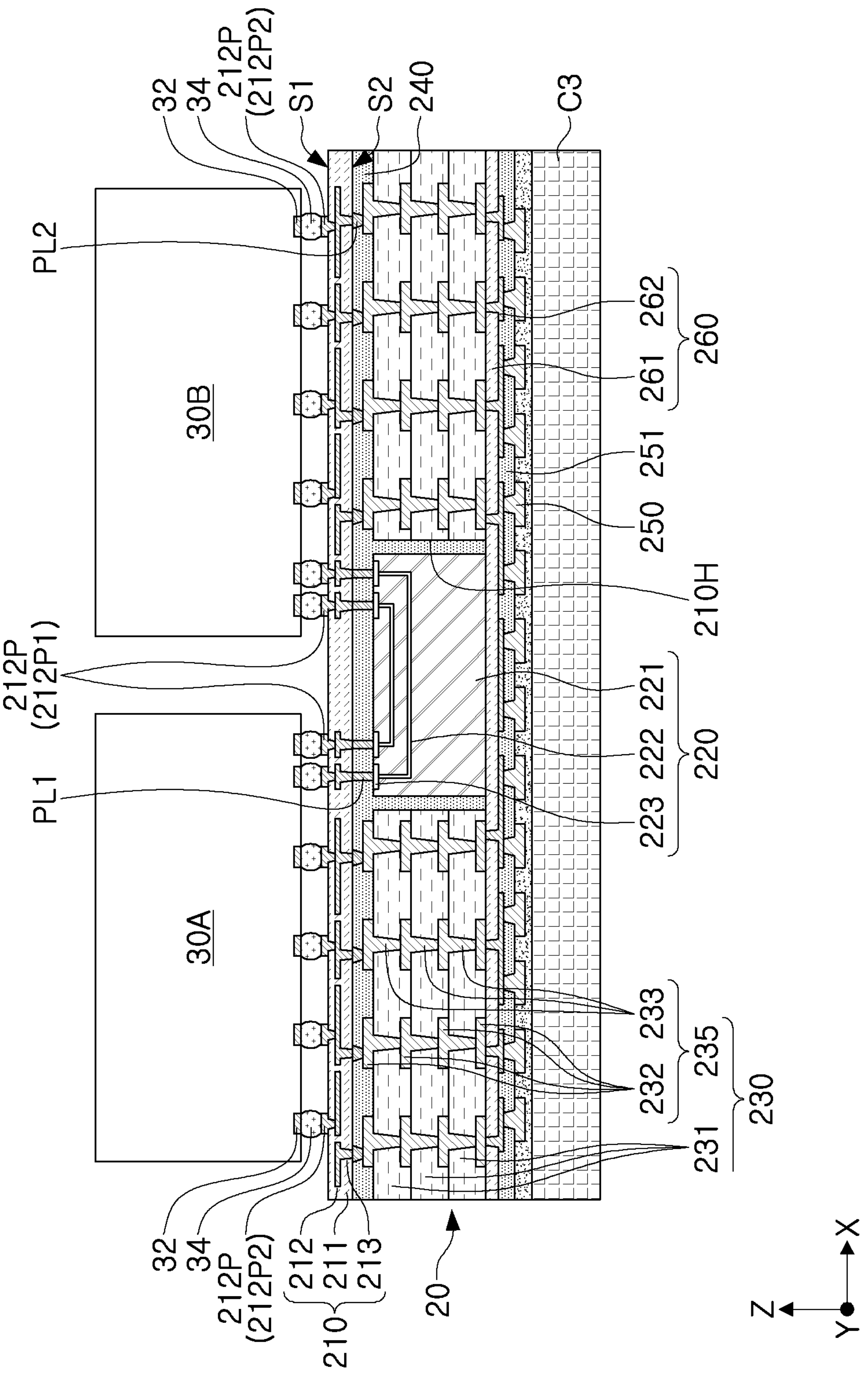

Referring to FIG. 9E, the first chip structure 30A and the second chip structure 30B may be mounted on the first redistribution member 210. The first chip structure 30A and the second chip structure 30B may be connected to the pad structures 212P through the solder bumps 34. Thereafter, a molding layer for sealing the first chip structure 30A and the second chip structure 30B may be formed, and after removing the third carrier C3, the connection bumps 250 are exposed, thereby manufacturing the semiconductor package 1*a* in FIGS. 1A and 1B.

As set forth above, according to example embodiments, a semiconductor package having a simplified process may be provided by introducing a pillar structure on the connection member and the interconnection chip.

While example embodiments have been illustrated and described above, it will be apparent to those skilled in the art that modifications and variations could be made without departing from the scope of the present inventive concept as defined by the appended claims.

What is claimed is:

1. A semiconductor package comprising:

a substrate including a first redistribution member including a first redistribution layer, and having a first surface and a second surface opposing each other, an interconnection chip disposed below the second surface and including an interconnection circuit electrically connected to the first redistribution layer and an interconnection pad coupled to the interconnection circuit, a via structure disposed around the interconnection chip and electrically connected to the first redistribution layer, an encapsulant filling a space between the second surface and the interconnection chip and the via structure, wherein a wiring layer of the via structure is embedded in the encapsulant, a first pillar passing through the encapsulant to electrically connect the first redistribution layer and the interconnection pad, the first pillar having a first height, a second pillar passing through the encapsulant to electrically connect the first redistribution layer and the wiring layer of the via structure such that the second pillar has a second height different from the first height, and connection bumps disposed below the interconnection chip and the via structure; and first and second chip structures disposed on the first surface of the first redistribution member and electrically connected to the first redistribution layer, wherein the first pillar and the second pillar have different shapes, wherein the first pillar has a shape in which a first upper width adjacent to the second surface and a first lower width adjacent to the interconnection pad are substantially the same, and wherein the second pillar has a tapered shape in which a second upper width adjacent to the second surface is greater than a second lower width adjacent to the wiring layer, wherein the interconnection pad has a first contact surface in contact with the first pillar, wherein the wiring layer has a second contact surface in contact with the second pillar, wherein the second contact surface is positioned closer to the second surface in a direction perpendicular to the second surface than the first contact surface, wherein the first redistribution member further includes a dielectric layer and a redistribution via passing through the dielectric layer and connecting the first redistribution layer to the first pillar or the second pillar, p1 wherein the redistribution via has a tapered shape in which a third upper width adjacent to the first redistribution layer is greater than a third lower width adjacent to the first pillar or the second pillar, and wherein the second upper width of the second pillar is greater than the third lower width of the redistribution via in a direction parallel to the second surface.

2. The semiconductor package of claim 1, wherein a width of an upper surface of the second pillar in contact with the second surface is greater than a width of an upper surface of the first pillar in contact with the second surface.

3. The semiconductor package of claim 1, wherein the dielectric layer includes a photosensitive resin.

4. The semiconductor package of claim 1, wherein the first and second chip structures are electrically connected to each other through the interconnection circuit.

5. The semiconductor package of claim 1, wherein the first redistribution member includes first pad structures disposed on the first surface and electrically connected to the interconnection circuit through the first redistribution layer, and second pad structures disposed on the first surface and electrically connected to the via structure through the first redistribution layer, wherein the first and second chip structures are electrically connected to the interconnection circuit through the first pad structures.

6. The semiconductor package of claim 5, wherein a first interval between the first pad structures adjacent to each other is less than a second interval between the second pad structures adjacent to each other.

7. The semiconductor package of claim 6, wherein the first interval ranges from about 10 μm to about 60 μm, and the second interval ranges from about 60 μm to about 100 μm.

8. The semiconductor package of claim 5, wherein a width of the first pad structures in a direction parallel to the first surface is substantially the same as a width of the second pad structures.

9. The semiconductor package of claim 1, wherein the substrate further includes a second redistribution member disposed between the connection bumps, the interconnection chip and the via structure, and including a second redistribution layer electrically connecting the via structure to at least one of the connection bumps.

10. The semiconductor package of claim 1, wherein the substrate further includes a connection member including the via structure and an insulating layer surrounding the via structure, and having a through-hole in which the interconnection chip is accommodated.

11. A semiconductor package comprising:

a substrate including a first redistribution member having a first surface and a second surface opposing each other, and including a first redistribution layer, an interconnection chip disposed below the second surface and including an interconnection circuit electrically connected to the first redistribution layer and an interconnection pad coupled to the interconnection circuit, a via structure disposed around the interconnection chip and electrically connected to the first redistribution layer, an encapsulant filling a space between the second surface and the interconnection chip and the via structure, wherein a wiring layer of the via structure is embedded in the encapsulant, a first pillar passing through the encapsulant to electrically connect the first redistribution layer and the interconnection pad, the first pillar having a first height, a second pillar passing through the encapsulant to electrically connect the first redistribution layer and the wiring layer of the via structure such that the second pillar has a second height different from the first height, and connection bumps disposed below the interconnection chip and the via structure; and first and second chip structures disposed on the first surface of the first redistribution member and electrically connected to the first redistribution layer, wherein the first pillar and the second pillar have different heights from each other, wherein the first pillar has a shape in which a first upper width adjacent to the second surface and a first lower width adjacent to the interconnection pad are substantially the same, wherein the second pillar has a shape in which a second upper width adjacent to the second surface is greater than a second lower width adjacent to the wiring layer, wherein the interconnection pad has a first contact surface in contact with the first pillar, wherein the wiring layer has a second contact surface in contact with the second pillar, and wherein the second contact surface is positioned closer to the second surface in a direction perpendicular to the second surface than the first contact surface, wherein the first redistribution member further includes a dielectric layer and a redistribution via passing through the dielectric layer and connecting the first redistribution layer to the first pillar or the second pillar, wherein the redistribution via has a tapered shape in which a third upper width adjacent to the first redistribution layer is greater than a third lower width adjacent to the first pillar or the second pillar, and wherein the second upper width of the second pillar is greater than the third lower width of the redistribution via in a direction parallel to the second surface.

12. The semiconductor package of claim 11, wherein the second height of the second pillar is smaller than the first height of the first pillar in the direction perpendicular to the second surface.

13. The semiconductor package of claim 11, wherein an upper surface of the first pillar is substantially on the same surface as an upper surface of the second pillar.

14. The semiconductor package of claim 11, wherein a width of an upper surface of the second pillar is greater than a width of an upper surface of the first pillar.

15. A semiconductor package comprising:

a first redistribution member having a first surface and a second surface opposing each other, and including a first redistribution layer;

an interconnection chip disposed below the second surface and including an interconnection circuit electrically connected to the first redistribution layer and an interconnection pad coupled to the interconnection circuit, a via structure disposed around the interconnection chip and electrically connected to the first redistribution layer;

an encapsulant having a first portion disposed between the second surface and the interconnection chip and the via structure and a second portion disposed on a side surface of the interconnection chip, wherein a wiring layer of the via structure is embedded in the encapsulant;

a first pillar passing through the first portion to electrically connect the first redistribution layer and the interconnection pad, the first pillar having a first height;

a second pillar passing through the first portion to electrically connect the first redistribution layer and the wiring layer of the via structure such that the second pillar has a second height different from the first height, and having a tapered shape decreasing in width towards the via structure;

a second redistribution member disposed below the interconnection chip and the via structure and including a second redistribution layer electrically connected to the via structure;

connection bumps disposed below the second redistribution member and electrically connected to the second redistribution layer; and first and second chip structures disposed on the first surface of the first redistribution member and electrically connected to the first redistribution layer, wherein the first pillar has a shape in which a first upper width adjacent to the second surface and a first lower width adjacent to the interconnection pad are the same, wherein the second pillar has a shape in which a second upper width adjacent to the second surface is greater than a second lower width adjacent to the wiring layer, wherein the interconnection pad has a first contact surface in contact with the first pillar, wherein the wiring layer has a second contact surface in contact with the second pillar, and wherein the second contact surface is positioned closer to the second surface in a direction perpendicular to the second surface than the first contact surface, wherein the first redistribution member further includes a dielectric layer and a redistribution via passing through the dielectric layer and connecting the first redistribution layer to the first pillar or the second pillar, wherein the redistribution via has a tapered shape in which a third upper width adjacent to the first redistribution layer is greater than a third lower width adjacent to the first pillar or the second pillar, and wherein the second upper width of the second pillar is greater than the third lower width of the redistribution via in a direction parallel to the second surface.

16. The semiconductor package of claim 15, wherein a width of a lower surface of the second pillar in contact with the wiring layer is greater than a width of a lower surface of the redistribution via in contact with the second pillar.

* * * * *